(12) United States Patent
 Aromin

(10) Patent No.: US 12,695,292 B1
(45) Date of Patent: Jul. 28, 2026

(54) DUAL-MODE GROUND-FAULT/LEAKAGE-CURRENT INTERRUPTER (GFCI/LCDI) INTERRUPTER AND SELF-TEST/END-OF-LIFE (STEOL)

(71) Applicant: Tower Manufacturing Corp., Providence, RI (US)

(72) Inventor: Victor V Aromin, West Warwick, RI (US)

(73) Assignee: Tower Manufacturing Corp., Providence, RI (US)

( * ) Notice: Subject to any disclaimer, the term of this patent is extended or adjusted under 35 U.S.C. 154(b) by 0 days.

(21) Appl. No.: 19/339,910

(22) Filed: Sep. 25, 2025

Related U.S. Application Data

(63) Continuation-in-part of application No. 19/063,815, filed on Feb. 26, 2025, now Pat. No. 12,451,683.

(51) Int. Cl.
| | |
|---|---|
| *H02H 3/32* | (2006.01) |
| *G01R 31/52* | (2020.01) |
| *G01R 31/54* | (2020.01) |
| *H02H 1/04* | (2006.01) |
| *H02H 3/05* | (2006.01) |

(52) U.S. Cl.
CPC .............. *H02H 3/32* (2013.01); *G01R 31/52* (2020.01); *G01R 31/54* (2020.01); *H02H 1/04* (2013.01); *H02H 3/05* (2013.01)

(58) Field of Classification Search
CPC ... H02H 3/32; H02H 1/04; H02H 3/05; G01R 31/52; G01R 31/54
See application file for complete search history.

(56) References Cited

U.S. PATENT DOCUMENTS

| | | | | |
|---|---|---|---|---|
| 6,720,872 B1 * | 4/2004 | Engel | ..................... | H01H 83/04 |
| | | | | 324/415 |
| 6,738,241 B1 * | 5/2004 | Aromin | ................ | H02H 1/0015 |
| | | | | 361/45 |
| 8,310,800 B1 * | 11/2012 | Williams | ................. | H01C 7/12 |
| | | | | 361/131 |

(Continued)

FOREIGN PATENT DOCUMENTS

WO WO-2008008091 A2 * 1/2008 ............... H02H 3/33

*Primary Examiner* — Monica Lewis
*Assistant Examiner* — Nicolas Bellido

(57) ABSTRACT

A dual-mode ground-fault/leakage-current interrupter (GFCI/LCDI) is disclosed. The device uses a single differential sense transformer around line and neutral to detect ground-fault (differential) conditions, and a cord-shield path to detect conductor-to-shield leakage and shield-integrity (open/high-resistance) faults. Shield continuity is supervised by detector-domain circuitry that, upon a fault, drives an isolated trigger coupler (ITC) to a common trip stage (e.g., SCR-latched) that opens the interrupter contacts. An optional grounded-neutral detection load (GNDL) on the load side enables detection of downstream neutral-to-ground bonds without a second transformer eliminating high frequency cross talk. A self-test/end-of-life (STEOL) module injects simulated faults, coordinates with the relay state, and, upon persistent failure, places the device in an end-of-life condition that prevents power delivery. The architecture reduces parts count, improves noise immunity, and unifies trip behavior for both GFCI and LCDI events.

18 Claims, 4 Drawing Sheets

(56)                    References Cited

U.S. PATENT DOCUMENTS

| | | | |
|---|---|---|---|
| 11,329,476 B1 * | 5/2022 | Aromin | H02H 1/0007 |
| 12,292,475 B1 * | 5/2025 | Aromin | G01R 31/3278 |
| 12,451,683 B1 * | 10/2025 | Aromin | G01R 31/3278 |
| 2004/0070899 A1 * | 4/2004 | Gershen | H02H 3/331 |
| | | | 361/42 |
| 2006/0181820 A1 * | 8/2006 | Elms | H02H 3/331 |
| | | | 361/42 |
| 2024/0357712 A1 * | 10/2024 | Tebbe | H05B 3/44 |

* cited by examiner

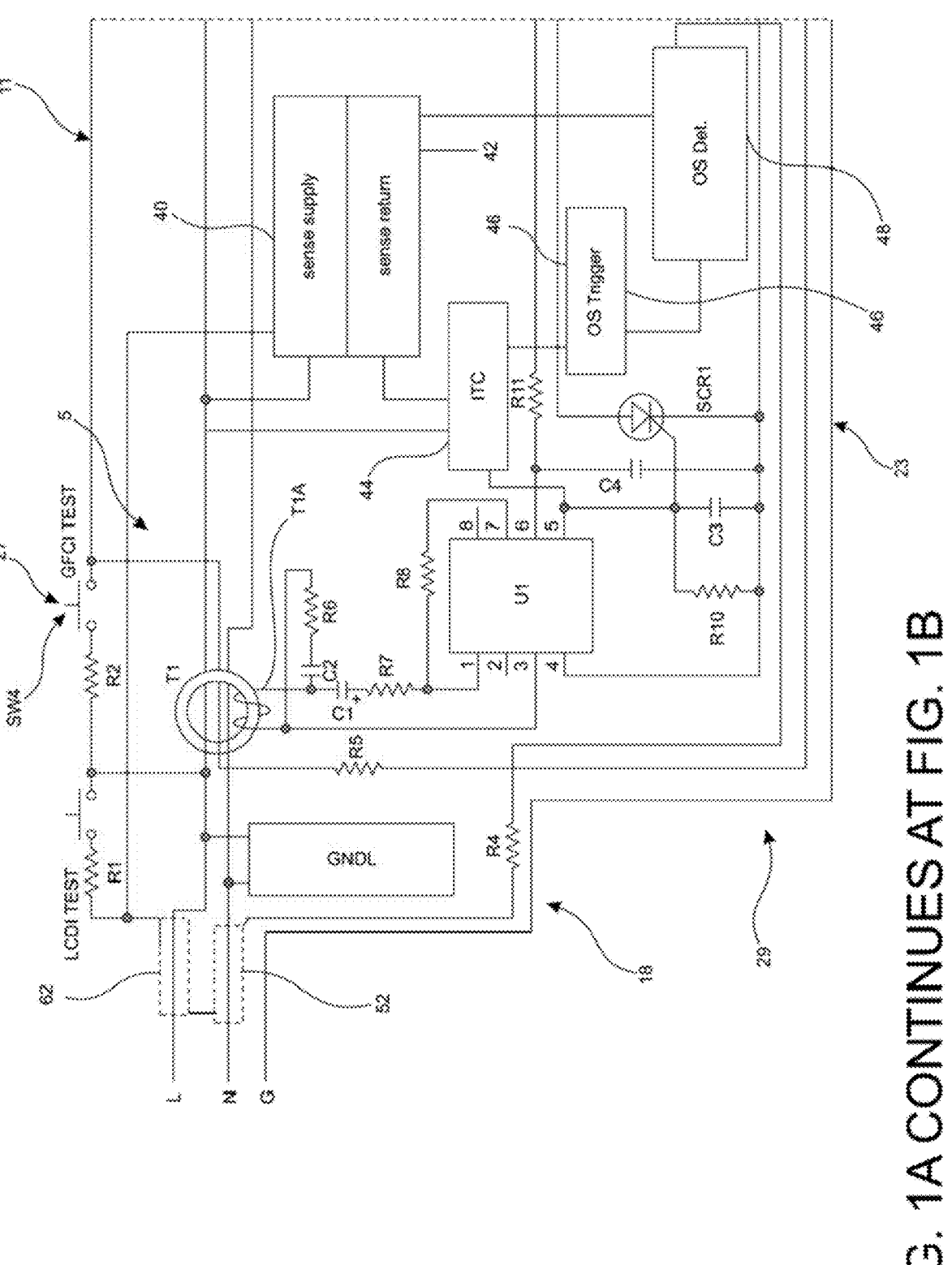
FIG. 1A CONTINUES AT FIG. 1B

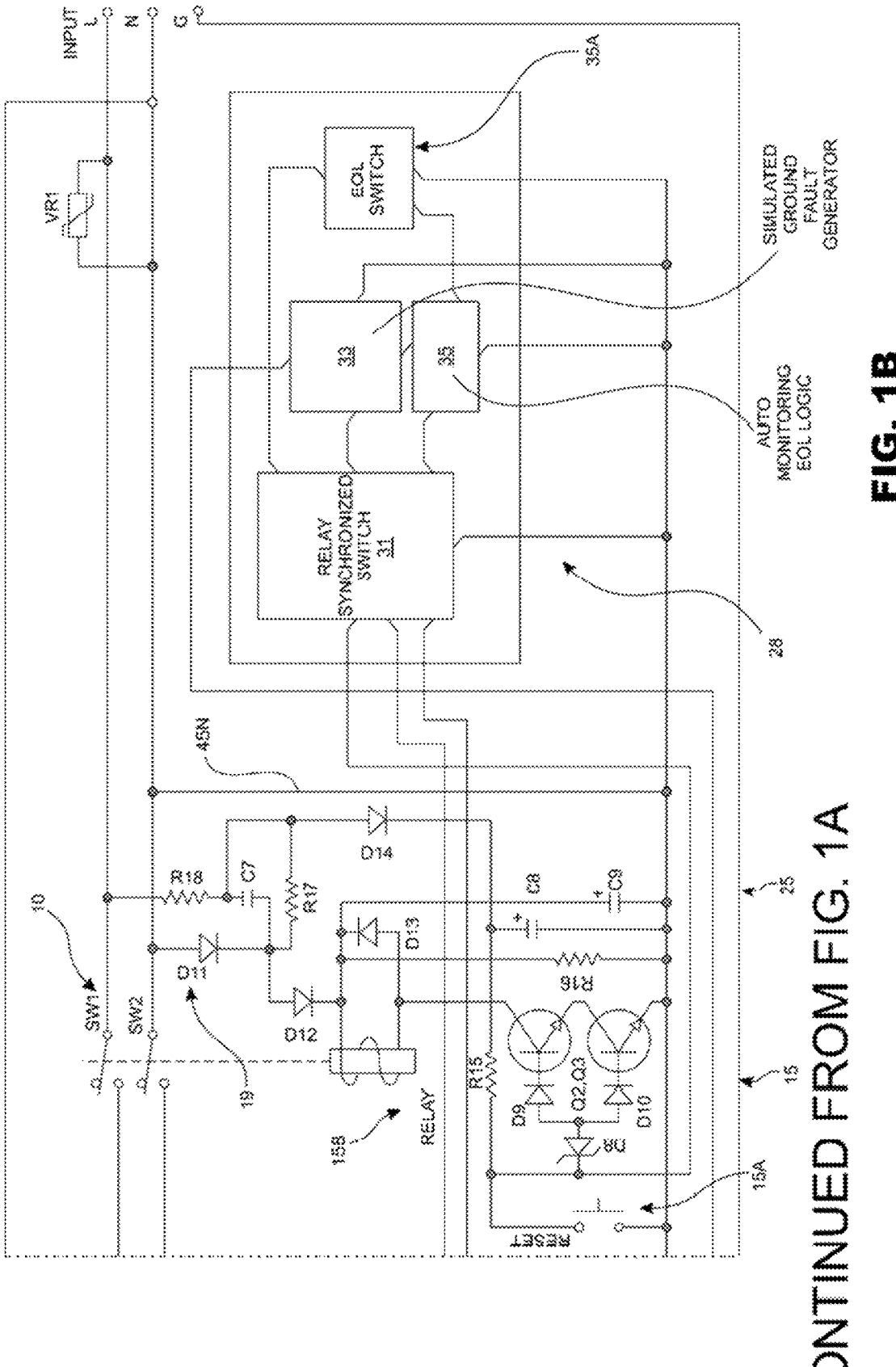
FIG. 1B
CONTINUED FROM FIG. 1A

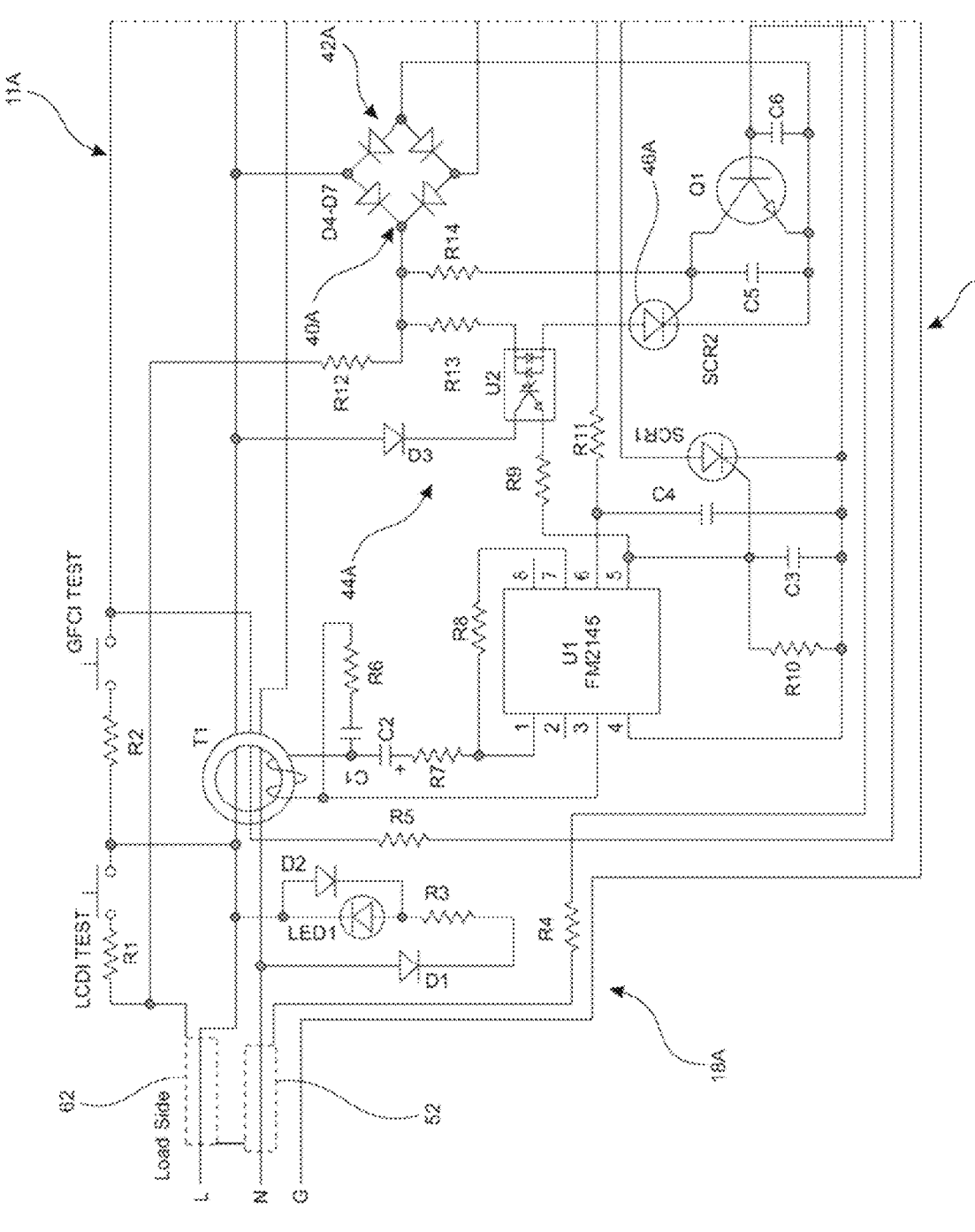
FIG. 2A CONTINUES AT FIG. 2B

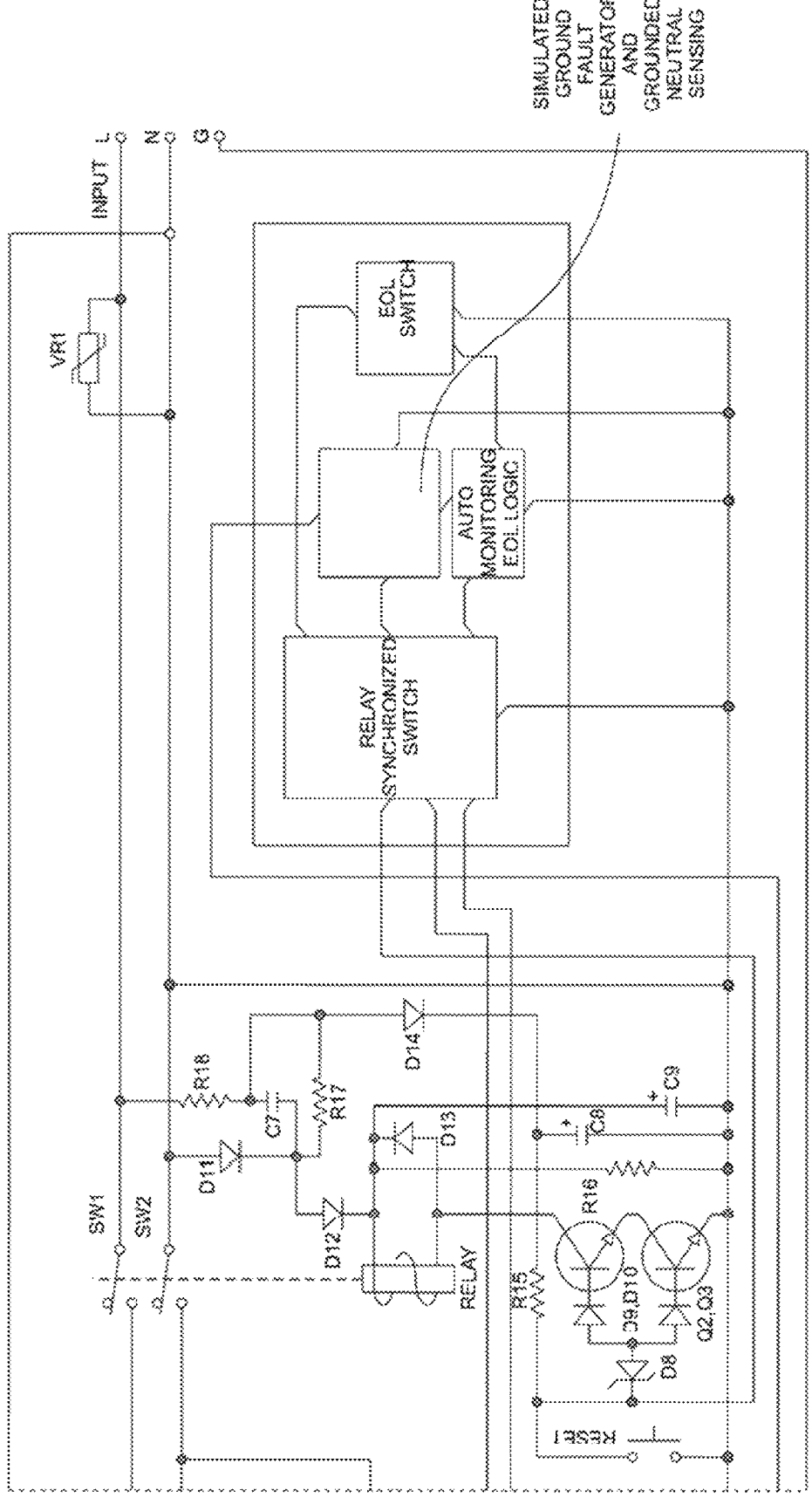
FIG. 2B
CONTINUED FROM FIG. 2A

DUAL-MODE GROUND-FAULT/LEAKAGE-CURRENT INTERRUPTER (GFCI/LCDI) INTERRUPTER AND SELF-TEST/END-OF-LIFE (STEOL)

CROSS REFERENCE

The present continuation-in-part application is related to, claims the earliest available effective filing date(s) from (e.g., claims earliest available priority dates for other than provisional patent applications; claims benefits under 35 USC § 119 (e) for provisional patent applications), and incorporates by reference in its entirety all subject matter of the following listed application(s) (the "Related Applications") to the extent such subject matter is not inconsistent herewith; the present application also claims the earliest available effective filing date(s) from, and also incorporates by reference in its entirety all subject matter of any and all parent, grandparent, great-grandparent, etc. applications of the Related Application(s) to the extent such subject matter is not inconsistent herewith:

U.S. patent application Ser. No. 19/063,815, entitled "High Frequency Resistant Nuisance Tripping GFCI and with Self-Test and End of Life (STEOL) Circuits", naming Victor V. Aromin as first inventor, filed Feb. 26, 2025.

1. FIELD OF USE

The present invention relates generally to electrical safety devices and more particularly to combined high frequency ground fault circuit interrupters (GFCI) and leakage current detector interrupters (LCDI) with self-test end-of-life circuitry and resistant to high frequency nuisance tripping.

2. DESCRIPTION OF PRIOR ART (BACKGROUND)

Conventional electrical appliances receive alternating current (AC) power from a supply (e.g., an electrical outlet) through a pair of conducting lines—line and neutral—that deliver operating current to the load. With the wide adoption of appliances such as air conditioners, washing machines, refrigerators, and the like, increased attention has been paid to user and property safety, particularly where appliance power cords are one meter or longer.

Over time, power cords can age or be damaged during movement, creating potentially dangerous conditions including ground fault, grounded neutral, and open neutral in the conducting lines, as well as leakage current within the cord itself. Leakage current can occur between the phase (line) conductor and the neutral or ground conductors in the cord and may cause arcing, fire, and property damage.

To detect leakage in appliance cords, some solutions provide an additional conductor electrically connected to a metal sheath that surrounds the line and neutral conductors; a voltage on the sheath indicates leakage. These sheaths are commonly woven from thin copper wires. However, the sheath can lose continuity due to structural failure or corrosion, which can prevent a leakage-current detecting interrupter (LCDI) from sensing hazardous conditions.

In parallel, ground fault circuit interrupters (GFCIs) are well known and used to protect against ground fault, grounded neutral, and open neutral conditions. Typical GFCIs sense imbalance between line and neutral currents (e.g., via a toroid and amplifier feeding a window comparator or a dormant-oscillator detector) and trip to open at least one conductor. Yet typical GFCIs may false-trip in response to wide-band noise (e.g., unplugging inductive loads), and may be susceptible to high-frequency (>60 Hz, up to ~150 kHz) leakage generated by modern variable-speed drives, inverter electronics, and other appliance circuitry.

Additional drawbacks of conventional GFCIs include reliance on relatively large solenoids that require line voltage to actuate and hold state, contributing to power draw and potential failure points. Under UL 943, panel- and receptacle-based GFCIs must indicate end-of-life if a manual test fails; nevertheless, some devices can still be reset and energize the load without ground-fault protection absent a power-denial feature, posing a safety risk if users assume that available power implies available protection.

Prior art approaches generally provide separate circuitry: one circuit to detect leakage via the cord's metal sheath (LCDI) and another to detect ground-fault-type conditions (GFCI). Multiple disparate circuits increase component count, board area, complexity, and production time. Moreover, failures in the metal sheath (structural integrity or corrosion) can defeat LCDI detection, while GFCIs alone do not address open-sheath integrity or certain high-frequency behaviors originating within appliance cords.

Accordingly, there is a need for a single, integrated protection architecture that (i) detects and interrupts ground fault, grounded neutral, and open neutral conditions; (ii) detects leakage in the appliance cord via the sheath path; and (iii) continuously monitors metal-sheath structural integrity and corrosion that could impair leakage detection—while also improving immunity to wide-band noise, accommodating high-frequency leakage components, supporting robust testing (manual and/or automatic), implementing end-of-life power denial, and reducing solenoid power and failure modes.

Notably, the known prior art does not disclose a dual GFCI-and-LCDI circuit that unifies these protections in a single detection and trip platform. Instead, prior solutions address GFCI and LCDI functions separately, leaving unaddressed the combined need for unified ground-fault protection, cord-leakage sensing, and continuous sheath-integrity monitoring within one integrated circuit architecture.

SUMMARY OF THE INVENTION

A dual-mode ground-fault and leakage-current interrupter (DMGI) is disclosed for interrupting current between supply terminals and load terminals via line and neutral conductors. The apparatus includes switching circuitry operable between a closed state connecting the supply terminals to the load terminals and an open state disconnecting the supply terminals from the load terminals. A single differential-current sense transformer encircles the line and neutral conductors and produces a secondary signal representative of line/neutral current imbalance. Ground-fault detection circuitry coupled to the secondary signal generates a ground-fault trip signal when a ground-fault criterion is satisfied. In addition, a leakage/continuity detection function associated with a flexible cord set detects conductor-to-shield leakage and/or shield-integrity faults and generates a leakage trip signal. A bi-stable electronic latch circuit is operatively coupled to the switching circuitry and, in response to either the ground-fault trip signal or the leakage trip signal, places the switching circuitry in the open state.

In certain embodiments, the cord set includes series-connected shield conductors respectively surrounding the line and neutral conductors, and shield-monitoring circuitry is provided to detect open or high-resistance shield conditions. The shield-monitoring circuitry can include a sense supply and sense return, an open-shield (OS) detector coupled to the sense supply through the series-connected shields, an OS trigger, and an isolated trigger coupler (ITC) having an input side connected between the sense supply and the OS trigger and an output side referenced to a trip/actuation return; the ITC conveys a control state to the trip stage and thereby provides the leakage trip signal. In some implementations the sense supply comprises a bridge-rectifier power supply, the OS detector comprises a transistor, the OS trigger comprises an SCR, and the ITC comprises an optocoupler or a micro-relay.

In further embodiments, a grounded-neutral detection load (GNDL) is connected across the load-side line and neutral conductors (e.g., an LED indicator circuit or a capacitive network) to facilitate detection of downstream neutral-to-ground bonds. The DMGI may also include a self-test module comprising a simulated ground-fault generator, a relay-synchronized switch configured to temporarily suppress normal ground-fault detection during self-test, an auto-monitoring logic module configured to determine whether self-test fails, and an end-of-life switch operable to disconnect the supply terminals from the load terminals in response to a self-test failure indication.

BRIEF DESCRIPTION OF THE DRAWINGS

The drawings, which are incorporated into and are a part of this specification, illustrate various embodiments of the invention and, together with the description, explain the principles of the invention. In the drawings wherein like reference numerals represent like parts:

FIGS. 1A and 1B are functional diagrams of an auto-reset dual-mode ground-fault and leakage-current interrupter (DMGI) with High Frequency (HF) tripping resistance and Self-Test and End of Life (STEOL) of the present invention; and FIGS. 2A and 2B are functional diagrams of the DMGI with HF tripping resistance and STEOL of the present invention as shown in FIGS. 1A and 1B.

DETAILED DESCRIPTION

The following brief definition of terms shall apply throughout the application:

The term "comprising" means including but not limited to, and should be interpreted in the way it is typically used in the patent context;

The phrases "in one embodiment," "according to one embodiment," generally mean that the particular feature, structure, or typical following the phrase may be included in at least one embodiment of the present invention, and may be included in more than one embodiment of the present invention (such phrases do not necessarily refer to the same embodiment);

If the specification describes something as "exemplary" or an "example," it should be understood that refers to a non-exclusive example; and If the specification states a part or feature "may," "can," "could," "should," "preferably," "possibly," "typically," "optionally," "for example," or "might" (or other such language) be included or have a characteristic, that part or feature need not be included or to have the characteristic.

High frequency may be defined as greater than 60 Hz up to 150 KHz.

Ground fault conditions may be defined as ground fault, grounded neutral, and open neutral conditions.

Leakage Current Detector Interrupter (LCDI) fault conditions may be defined as conductor-to-shield leakage within the power cord (line-to-shield or neutral-to-shield), an open or discontinuous shield, and degraded shield continuity (e.g., corrosion or elevated shield resistance) that impairs leakage detection.

Referring now to the drawings, and particularly to FIGS. 1A and 1B, there is shown a Dual-Mode GFCI/LCDI Interrupter (DMGI)—an integrated ground-fault circuit interrupter and leakage-current detector interrupter—constructed in accordance with the present disclosure, identified generally by reference numeral 11.

DMGI 11 automatically protects a load from ground fault conditions upon the initial connection of Input L to Load L and Input N to Load N. After DMGI 11 trips due to a ground fault condition, reset switch 15A allows manual restoration of power to the load.

GFCI Components. The GFCI portion of DMGI 11 includes ganged switch 10, relay coil control circuit 15, GFCI relay coil 15B, power-supply circuit 19, ground-fault detection circuit 29, bi-stable electronic latch circuit 23, filter circuit 25, grounded neutral detection load (GNDL) 18, and trip-indicating wire 5. The GFCI test module 28 includes a relay coil-synchronized switch 31, a self-test circuit 33, and an end-of-life (EOL) circuit 35 with associated EOL switch 35A. It will be appreciated that the GFCI circuits are powered by supply line L and neutral N via line 45N. It will be further appreciated that an open-neutral at the DMGI 11 input disables relay coil 15B, thereby preventing line voltage from being applied to the output load.

Circuit breaker 10 includes a pair of single-pole, double-throw switches SW1 and SW2 in the line and neutral conductive lines, respectively, between a power source and a load. Switches SW1 and SW2 can be positioned in either of two connective positions. In the first connective position, which is illustrated in FIG. 1, switches SW1 and SW2 are positioned such that the input power source is not connected to the load In the second connective position, which is the opposite position illustrated in FIG. 1, switches SW1 and SW2 are positioned such that the input power source is connected to the load.

Relay coil control circuit 15 selectively positions switches SW1 and SW2 in either its first connective position or its second connective position. Relay coil control circuit 15 comprises a solenoid relay coil 15B, transistors Q2, Q3, Diodes D9, D10; and a biasing circuit comprising resistor R15, Zener D8, and reset switch 15A.

Transistors Q2, Q3 are, for example, MMBTA41 high voltage transistors for controlling current flow through relay coil 15B. When transistors Q2, Q3 are "off", current through relay coil 15B is disabled. When transistors Q2, Q3 are "on", relay coil 15B is energized.

The GFCI components and associated control electronics of DMGI 11 are powered from the supply side input L and return line N via line 45N. A power-supply circuit 19 derives the required operating power and includes silicon rectifiers D11 and D12, voltage-dropping resistors R17 and R18, and capacitor C7. D11/D12 convert the AC line to a DC supply; R17/R18 set and limit the effective input to the control circuitry and relay coil 15B; and the reactance of C7 limits current through the rectifiers and conditions the voltage presented to the relay coil. C7 may be any suitable value selected to achieve the desired current limiting. In the event of an open-neutral condition at the input of DMGI 11, relay coil 15B is disabled, thereby preventing SW1 and SW2 from assuming their second connective state, so that line voltage is not applied to the output load. The capacitive-dropper supply arrangement reduces heat buildup in a confined space and optimizes energy delivered to relay coil 15B-increasing contact force and enabling a smaller, more rugged, and higher-performance DMGI.

Power-supply circuit 19 also includes a rectifying diode D14 coupled to the dropper network (R17, R18, and C7, with D11/D12) to derive an auxiliary low-power DC feed for the GFCI portion of DMGI 11 (e.g., the fault-detector IC, comparator/logic functions, indicators, and self-test/EOL circuits). In one embodiment, D14 half-wave rectifies the R17/R18 dropper node and, together with associated filtering and/or regulation as shown, develops a bias rail referenced to Neutral (N). Because this rail shares the dropper impedance with the relay-coil path, it is functionally separate but not fully independent; however, the D14 unidirectional conduction and local filtering provide practical decoupling, yielding (i) a stable operating bias for the GFCI electronics during normal operation, (ii) orderly start-up wherein the detector electronics typically reach operating voltage before or contemporaneously with coil actuation, and (iii) reduced (rather than eliminated) coupling/back-feed between the coil supply and the low-power electronics during transients and trip events. In certain embodiments, an additional series resistor may be included between the dropper node and D14 to further enhance decoupling.

Still referring to FIGS. 1A and 1B, C8 and C9 remove high-frequency noise from the power supply 19, preventing unwanted fluctuations in circuit operation and enhances circuit stability by filtering out high frequency noise that could otherwise interfere with the DMGI's fault detection. It will be further appreciated that C8 and C9 work together to enhance circuit stability, reduce false trips, and suppress high-frequency noise that could interfere with proper DMGI function.

Continuing with FIGS. 1A and 1B, DMGI 11 employs a single differential-current sense transformer T1 that encircles both the line (L) and neutral (N) conductors. In balanced operation the currents are equal and opposite, yielding approximately zero net ampere-turns, and the transformer secondary T1A develops substantially no output. Fault conditions—such as grounded neutral or conductor-to-shield leakage downstream of DMGI 11—produce a current imbalance that induces a proportional secondary signal on TIA. This single-toroid architecture eliminates parasitic coupling between multiple transformers that can cause high-frequency (>60 Hz) nuisance tripping, while also reducing parts count and simplifying construction.

Still referring to FIGS. 1A and 1B. The fault-detector integrated circuit U1 (for example, an FM2145 device, although other suitable ICs may be used) amplifies the signal generated by TIA and, when a trip threshold is met, produces an output pulse at Pin 5 that is applied to latch circuit 23.

In one embodiment, U1 provides a reference node at Pin 3, an inverting input (VFB) at Pin 1, and an internal amplifier output at Pin 7. Components C1, C2, R6, R7, and R8 are arranged about these pins to stabilize the reference, set gain and threshold, and shape bandwidth for noise immunity, without introducing any intentional excitation through T1. More particularly: (i) a capacitor C2 coupled to Pin 3 decouples the reference and presents an AC ground for the internal amplifier network, stabilizing thresholds and suppressing line-borne noise; (ii) a capacitor C1 is coupled in the amplifier network (e.g., in parallel with R8 or between VFB and the reference node) to provide frequency compensation/roll-off, thereby rejecting wide-band disturbances (such as unplug transients or inverter noise) and preventing nuisance tripping; (iii) a resistor R6 coupled between Pin 3 and the C2 node provides isolation/damping of the reference and, together with C2, defines a reference-filter corner frequency; (iv) a resistor R7 couples the C2 (reference) node to VFB (Pin 1) to bias the inverting input and set the DC operating point/threshold so that only legitimate fault signatures drive the detector to trip; and (v) a resistor R8 connects Pin 7 (amplifier output) to VFB (Pin 1) to form the principal closed-loop feedback determining detector gain and response. In certain embodiments a small capacitor in parallel with R8 establishes a dominant pole for controlled bandwidth.

After detection of a ground-fault, grounded-neutral condition, or a leakage current on the load side of DMGI 11, U1 generates the output pulse at Pin 5 to activate latch circuit 23, which de-energizes relay coil 15B to remove power from the load. In one embodiment, latch circuit 23 comprises a silicon-controlled rectifier SCR1 operable in either a conductive or non-conductive state, a noise-suppression capacitor (e.g., C3 when arranged in the latch path), and a reset switch 15A.

In its conductive state rectifier SCR1 turns off transistors Q2, Q3 in relay circuit 15 via relay synchronized switch 31, discussed in more detail herein. Noise suppression capacitor C3 prevents rectifier SCR1, when in its nonconductive state, from firing because of electrical noise in circuit 11. Reset switch 15A is a conventional push-in type switch and when depressed and shorts the holding current from the anode of rectifier SCR1, causing rectifier SCR1 to turn off when it is in its conductive state. SCR1 may be any suitable bi-stable latching device.

Resistor R11 and capacitor C4 act as a filter circuit to smooth out the varying DC voltage from the power supply via module 28 and provide a filtered DC voltage to the power input of IC U1. C4 also provides temporary IC VCC when the DMGI 11 is in automatic self-test mode.

GFCI test switch circuit 27 lets the GFCI part of DMGI 11 be manually tested. It includes a current-limiting resistor R2 and a push-to-test switch SW4. When SW4 is pressed, the Line (L) is connected through R2 to Neutral (N) to create a small, intentional imbalance. The sense transformer T1 detects this imbalance and sends a signal to U1 which triggers latch circuit 23, turns relay coil 15B off, and cuts power to the load.

With the load plugged into the power source, if there is a loss of power at the power source, relay coil 15B will become de-energized, moving switches SW1 and SW2 back to their first connective position. When power is restored, relay coil 15B will become re-energized again, which moves switches SW1 and SW2 to their second position. It will be further appreciated that an open neutral on the input side of the DMGI 11 disables relay coil 15B 1 which prevents line voltage being applied to the output load.

Continuing with FIGS. 1A and 1B, a Grounded-Neutral Detection Load (GNDL) 18 is provided as a permanent load across the load-side line (L) and neutral (N) of DMGI 11. In normal operation without a downstream neutral-to-ground bond, current drawn by 18 returns on the neutral conductor that passes through the differential sense transformer T1, thereby maintaining substantially balanced line/neutral currents and a minimal secondary output. When a grounded-neutral condition exists downstream, the return path presents a lower impedance via the neutral-to-ground bond and associated equipment-grounding conductor, so the permanent-load current bypasses T1, creating a detectable line/neutral current imbalance; the fault-detection circuit (U1)

amplifies the resulting signal and, upon reaching a threshold, actuates the common trip/actuation mechanism by driving SCR1 to interrupt power.

It will be appreciated that any suitable permanent load may be used. In one embodiment providing low heat dissipation, the permanent load is a capacitive network: a Class X2 film capacitor $C_X$ connected across L-N(load side), a bleeder resistor $R_B$ connected in parallel with $C_X$ for safety discharge, and a series surge-damping resistor $R_S$ in series with a capacitor lead. This network presents a continuous, predominantly reactive current so enclosure heating is minimal, yet provides sufficient RMS current that, under a grounded-neutral condition downstream, the return path prefers the neutral-to-ground bond and bypasses T1, producing a measurable line/neutral imbalance detected by the GFCI portion.

The permanent-load function may be realized in various implementations, including, by way of example: (i) a resistive/LED indicator network with current limiting and half- or full-wave rectification to provide both visual status and permanent-load current (See FIGS. 2A and 2B); (ii) the predominantly reactive capacitive network described above (Class X2 $C_X$ with parallel $R_B$ and series $R_S$) to deliver the required RMS current with low real-power dissipation; and (iii) hybrid combinations wherein a minimal LED indicator is supplied separately while the primary permanent-load current is provided by a capacitive element. This arrangement advantageously enables grounded-neutral detection using only the single differential transformer T1, obviating auxiliary drive transformers and reducing susceptibility to high-frequency cross-coupling and false trips.

Still referring to FIGS. 1A and 1B relay Synchronized Switch 31 enables a circuit path between power supply 19 for U1 VCC Pin 6 and SCR1 to turn off transistors Q2, Q3 if U1 detects a ground fault as described earlier. Self-test circuit 33 isolates the ground fault sensing circuitry (e.g., T1, U1, and SCR1) from normal ground fault sensing operations while the sensing circuitry is automatically tested. Self-test circuit 33 generates a short current pulse on Test Wire 5 through T1 which is sensed by U1 as a ground fault. U1 generates a trigger signal to SCR 1 gate. If U1, SCR1, or Sense Coil T1 are defective SCR1 will not turn on and discharge a rising charge in Auto Monitoring End of Life Logic 35. The rising charge will build to End of Life Switch 35A on voltage which will turn off relay coil 15B and disengage output power as described above.

Continuing with FIGS. 1A and 1B, in one embodiment the flexible cord includes two shield conductors: a first shield 62 surrounding the line (L) conductor and a second shield 52 surrounding the neutral (N) conductor, the two shields being connected in series on the load side of DMGI 11. Leakage from L to its surrounding shield 62 and/or from N to its surrounding shield 52 returns outside the nominal L-N path, producing a net current imbalance that is detected by the single differential-current sense transformer T1, which encircles both the L and N conductors. During normal operation, currents in L and N are substantially equal and opposite, yielding negligible net flux in T1. If insulation damage or moisture causes conductor-to-shield leakage, a portion of the return current may flow through the series-connected wire shields 62, 52 or another path that does not pass through T1, producing a net current in the T1 secondary TIA. This differential current induces a secondary signal on TIA that is applied to the fault-detector IC (e.g., U1). When the signal meets a trip threshold established by the amplifier/threshold network described earlier, the detector U1 generates a pulse to the common GFCI trip platform driving SCR1, thereby interrupting power to the load.

Because only a single sense transformer T1 is employed, high-frequency (>60 Hz) nuisance tripping due to cross-talk between multiple transformers is reduced. In certain embodiments, loop-shaping elements (e.g., feedback resistor R8 with an optional parallel capacitor and reference decoupler C2) provide bandwidth control and noise immunity without introducing intentional excitation through T1.

Still referring to FIGS. 1A and 1B, the open-shield circuit includes sense supply 40, sense return 42, series-connected shields 62, 52, open-shield detector 48, open-shield trigger 46, and isolated trigger coupler (ITC) 44. Independently of differential current sensing, continuity of the series-connected wire shields 52 is monitored for continuity and integrity (open or high-resistance conditions) by applying a bias from the sense supply 40 to the shield 52 and sensing the return at an Open-Shield (OS) detector 48. If the shield path is intact, the OS detector 48 holds its output low.

If the series-connected shields 62, 52 are open or degraded (e.g., corrosion or elevated resistance), the OS detector 48 generates a high-level output, which triggers the OS trigger 46 and in turn drives the ITC 44. The ITC 44 then enables the SCR1 gate-drive path triggering SCR1 into conduction, thereby de-energizing relay 15B and opening the interrupter contacts SW1, SW2.

It will be appreciated that the conductor-to-shield leakage and open-/high-resistance shield faults are both routed to the GFCI trip/actuation path described earlier. In preferred embodiments, the LCDI sensing chain and the trip/actuation chain are powered by separate supplies with distinct returns, which may each be derived from the mains but remain electrically independent: a first, detector-domain supply (e.g., sense supply 40) referenced to a detector return (SENSE_RETURN) energizes the shield continuity network (the series shields 52, OS detector 48, and OS trigger 46); and a second, the GFCI actuator-domain supply (e.g., a rectified source obtained after a line rectifier such as D3) referenced to Neutral energizes the gate-drive path that ultimately triggers SCR1. The ITC 44 couples the open shield fault indication across the isolation barrier without creating a conductive tie between SENSE_RETURN and Neutral, thereby preserving reference integrity and blocking conducted noise.

The OS detector-side supply (sense supply 40) may be realized by, without limitation, a full-wave bridge, an auxiliary transformer winding, an impedance dropper, or a low-power isolated DC/DC module. The term "supply" denotes the functional source and its reference; the invention is not limited to any particular topology.

The ITC 44 may be implemented by: (a) an optocoupler (LED input; transistor/MOSFET or logic output); (b) a micro-relay (detector-side coil; normally-open contact in the gate path); (c) a pulse transformer driving a high-voltage transistor sink or source in the gate path; or (d) an isolated driver that controls a discrete high-voltage transistor. In each case, the input element of the ITC resides in the detector domain (referenced to SENSE_RETURN) and the output element resides in the GFCI actuator domain (referenced to Neutral via line 45N), thereby preserving reference isolation while enabling the SCR1 gate path when a fault is present.

The OS detector 48 is configured to monitor the continuity and integrity (open or high-resistance conditions) of the series-connected shields 62, 52 when biased by the sense supply 40 (with respect to sense return 42), and to assert an OS trigger 46 upon detection of an out-of-tolerance condition. In various embodiments, the OS detector may: (i) sense loop current through a burden resistor and compare it to a threshold with a window or Schmitt comparator to discriminate intact, degraded, and open shields; (ii) sense loop voltage via a divider and compare to a reference to detect an open circuit (voltage near the source) versus normal continuity (voltage collapsed); (iii) employ a rectified or AC-coupled bias (e.g., via a small bridge and series resistor) to reduce polarization effects and improve corrosion detection, with the detector measuring the effective impedance of the shield loop; (iv) include time-domain filtering or integration to ignore transients and contact bounce while capturing intermittent opens via a glitch-latch; (v) be realized with discrete components (e.g., a transistor "open-circuit monitor," operational amplifier, and reference network) or with an IC or microcontroller/ADC executing the same comparisons; and/or (vi) directly drive the OS trigger 46 (e.g., a low-power thyristor, MOSFET, or logic output) which, in turn, actuates the Isolated Trigger Coupler (ITC) 44.

In all cases, the OS detector operates in the detector domain referenced to SENSE_RETURN, and its output, via the OS trigger 46 and ITC 44, enables the GFCI trip/actuation path referenced to N to fire SCR1 and remove power when an open-shield or high-resistance fault is present.

Referring also to FIGS. 2A and 2B there is shown a schematic diagram of the DMGI with HF tripping resistance and STEOL of the present invention as shown in FIG. 1. In one embodiment, continuity of the series-connected wire shields 62, 52, encircling L and N, respectively, is monitored by a low-energy detector 48A powered from bridge rectifier D4-D7 42A. The bridge 42A presents a pulsating DC sense 40A that biases an open-circuit monitor transistor Q1 through the shield string 62, 52. With the shield path intact, Q1 is driven ON and clamps the SCR2 46A gate node near the bridge return so that gate current remains below the SCR2 gate-trigger current. With SCR2 off, no current flows in the LED side of opto-isolator U2, the opto-isolator U2 transistor is OFF, and the downstream trip path is inhibited.

With the shield open or degraded, Q1 turns OFF, and the gate node rises via the rectified sense source (through R14), allowing gate current to exceed $I_{GT}$ so that SCR2 triggers. The resulting LED current through ITC 44A U2 turns the isolator ON, which enables the SCR1 gate-drive path (via D3 and the gate network).

On the U2 actuation side (referenced to Neutral), D3 half-wave rectifies Line to provide a trip-supply to SCR1. When U2 is ON, its collector-emitter path completes the SCR1 gate-drive circuit. As the SCR1 gate node rises to the device's gate-trigger voltage, SCR1 conducts (during the same half cycle that SCR2 triggered) and actuates the GFCI trip/actuation OFF circuit: the relay coil 15B is de-energized, SW1 and SW2 return to their first (open) positions, and line voltage is not applied to the load. Ground isolation is maintained because the bridge/Q1/SCR2/U2-LED network resides in the shield-referenced detector domain, while D3/U2-transistor/R9/R10/C3/SCR1 reside in the GFCI trip/actuation domain referenced to Neutral; U2 transfers only the control state across this boundary.

It will be appreciated that the bridge D4-D7 ensures polarity-independent shield monitoring (sense bias exists on both AC half-cycles). With an intact shield, Q1 conducts on each half-cycle, clamping its collector and preventing nuisance triggering of SCR2. With the shield open or degraded, Q1 turns OFF and the gate node rises via the rectified sense source (through R14), allowing gate current to exceed $I_{GT}$ so SCR2 triggers, which in turn triggers SCR1. Once SCR1 trips the GFCI, line to the load is opened and the system requires a manual reset. If the shield fault persists, any subsequent reset attempt re-asserts the OS detection and re-trips via the same path.

In other embodiments, the open-circuit monitor may be implemented by a comparator or microcontroller input instead of Q1; the threshold element may be a MOSFET, Schmitt trigger, or triac in place of SCR2; the isolation coupler (U2) may be a micro-relay contact, a pulse transformer, or an isolated driver; the sense source may be a half-wave rectifier, capacitive/impedance dropper, or auxiliary winding; and the actuation rectifier D3 may be replaced by an equivalent trip-supply arrangement referenced to Neutral.

Continuing with FIGS. 2A and 2B. Indicator circuit 18A provides a means of visual sign that the DMGI is functioning normally and has not tripped in response to a fault condition. Indicator circuit 18 includes diodes D2, D1, a light emitting diode LED 1 and a current limiting resistor R3. Diode D1 half wave rectifies the AC power of the line to pulsating DC power for diode LED.

In addition to providing a visual status, indicator circuit 18 operates as a permanent neutral-referenced load on the load side of DMGI 11. In the non-interrupt state (SW1/SW2 closed), D1 half-wave rectifies L_LOAD and, with R3, drives LED1, so a continuous L→18A→N current flows through and returns via T1. This establishes a small but deliberate neutral return current (e.g., on the order of a few milliamperes) that is present even when no user appliance is connected, thereby defining a baseline condition in which line and neutral currents cancel in T1 and the T1 secondary output remains minimal. If there is a downstream neutral-to-ground bond, the return path for the permanent load 18A, bypasses T1, creating a detectable line/neutral imbalance The fault-detection IC U1 amplifies this imbalance and, upon reaching threshold, drives SCR1 to actuate the GFCI trip/actuation OFF function.

Advantages. The disclosed single-toroid architecture (T1) eliminates inter-transformer coupling paths, thereby improving high-frequency false-trip resistance while reducing parts count and simplifying construction/calibration. A unified trip platform that routes both GFCI and LCDI conditions to the common SCR1 path avoids duplicate actuators and ensures consistent interruption behavior. The use of independent detector and GFCI trip/actuation domains coupled by the Isolated Trigger Coupler (ITC 44) provides noise isolation and supports safety clearances/creepage across the isolation barrier. In certain embodiments, an optional capacitive permanent load on the load side yields the grounded-neutral detection current with very low heat dissipation, further enhancing enclosure thermal performance.

It will be further appreciated that the DMGI is partitioned into a detector subsystem (including the shield-biased open-shield circuitry and its sense supply/return) and a GFCI trip/actuation subsystem (including the SCR gate network, relay drive, and a trip supply referenced to Neutral). A coupling element (e.g., opto-isolator U2, micro-relay contact, or pulse transformer) conveys only a control state from the detector subsystem to the trip/actuation subsystem while maintaining electrical separation, i.e., no direct conductive connection-between their reference nodes.

The detector-trip/actuation domain separation implemented by a coupling element 44 (e.g., U2 opto, a micro-relay contact, or a pulse transformer)—which conveys only a control state while maintaining electrical separation (no direct conductive connection) between the OS detector subsystem return and Neutral (trip/actuation subsystem return)—(i) limits fault-energy transfer between subsystems,

11

(ii) preserves detector thresholds during open-neutral events by preventing unintended ties or ground loops between returns, and (iii) confines SCR-gate transients, relay switching spikes, and wide-band line disturbances to the trip/actuation subsystem, reducing nuisance trips.

It will be understood that versions of the present invention described above are intended to be merely exemplary and those skilled in the art shall be able to make many variations and changes to it without departing from the spirit of the present invention. All such variations and changes are intended to be within the scope of the present invention as defined in the added claims.

What is claimed:

1. A dual-mode ground-fault and leakage-current interrupter (DMGI) for interrupting current between supply terminals and load terminals via line and neutral conductors, comprising:

switching circuitry operable between a closed state connecting the supply terminals to the load terminals and an open state disconnecting the supply terminals from the load terminals;

series-connected shield conductors surrounding the line and neutral conductors;

a single sense transformer encircling the line and neutral conductors, the single sense transformer producing secondary signals in response to current imbalances;

fault detection circuitry coupled to the single sense transformer and operable to detect both ground fault conditions and conductor-to-shield leakage conditions based on the secondary signals;

shield monitoring circuitry for detecting open or high-resistance conditions in the series-connected shield conductors; and a first bi-stable electronic latch circuit responsive to the fault detection circuitry and the shield monitoring circuitry to actuate the switching circuitry to the open state.

2. The DMGI as in claim 1 wherein the shield monitoring circuitry comprises:

a second power supply comprising:

a sense supply, wherein the sense supply is connected to the series-connected shield conductors surrounding the line and neutral conductors;

a sense return;

an open shield (OS) detector coupled to the sense supply via the series-connected shield conductors;

an OS trigger connected to the OS detector;

an isolated trigger coupler (ITC) having an input side and an output side, wherein the ITC input side is connected between the sense supply and the OS trigger and ITC output side is connected between the line conductor and the first bi-stable electronic latch circuit.

3. The DMGI as in claim 2 wherein the second power supply comprises a bridge rectifier power supply.

4. The DMGI as in claim 2 wherein the OS detector comprises an npn transistor.

5. The DMGI as in claim 2 wherein the OS trigger comprises an SCR.

6. The DMGI as in claim 2 wherein the ITC comprises an optocoupler.

7. The DMGI as in claim 2 wherein the ITC comprises a micro relay.

8. The DMGI as in claim 1 further comprising a grounded neutral detection load (GNDL).

9. The DMGI as in claim 8 wherein the GNDL comprises an LED circuit.

10. The DMGI as in claim 8 wherein the GNDL comprises a capacitive network circuit.

11. The DMGI as in claim 1 further comprising:

a self test module, the self test module comprising:

a simulated ground fault generator for simulating a self test ground fault;

a relay synchronized switch connected to the simulated ground fault generator, wherein the relay synchronized switch disables fault detection circuitry during self test;

an auto-monitoring logic module connected to the simulated ground fault generator, wherein the auto-monitoring logic module determines if self test fails; and an end-of-life switch operable to disconnect the supply terminals from the load terminals upon a self test failure signal from the auto-monitoring logic module.

12. A dual-mode ground-fault and leakage-current interrupter (DMGI) for interrupting current between supply terminals and load terminals via line and neutral conductors, comprising:

switching circuitry operable between a closed state connecting the supply terminals to the load terminals and an open state disconnecting the supply terminals from the load terminals;

series-connected shield conductors surrounding the line and neutral conductors;

a single differential-current sense transformer encircling the line and neutral conductors and producing a secondary signal representative of current imbalance;

ground-fault detection circuitry coupled to the secondary signal and configured to generate a ground-fault trip signal when a ground-fault criterion is satisfied;

leakage-current detection circuitry configured to detect conductor-to-shield leakage and shield-integrity faults and to generate a leakage trip signal;

shield-monitoring circuitry configured to detect open or high-resistance conditions in the series-connected shield conductors; and a bi-stable electronic latch circuit operatively coupled to the switching circuitry and configured, in response to either the ground-fault trip signal or the leakage trip signal, to place the switching circuitry in the open state, wherein the bi-stable electronic latch circuit is responsive to the shield-monitoring circuitry.

13. The DMGI of claim 12 wherein the shield-monitoring circuitry comprises:

a sense supply and a sense return forming a detector-domain power source;

an open-shield (OS) detector coupled to the sense supply through the series-connected shield conductors;

an OS trigger driven by the OS detector; and an isolated trigger coupler (ITC) having an input side connected between the sense supply and the OS trigger and an output side referenced to a trip/actuation return, the TTC being operative to convey a control state to the bi-stable electronic latch circuit.

14. The DMGI of claim 13 wherein the ITC comprises an optocoupler.

15. The DMGI of claim 12 further comprising a grounded-neutral detection load (GNDL) connected across the load-side line and neutral.

16. The DMGI of claim 15 wherein the GNDL comprises an LED indicator circuit.

17. A dual-mode ground-fault and leakage-current interrupter (DMGI) for interrupting current between supply terminals and load terminals via line and neutral conductors, comprising:

switching circuitry operable between a closed state connecting the supply terminals to the load terminals and an open state disconnecting the supply terminals from the load terminals;

a single differential-current sense transformer encircling the line and neutral conductors and producing a secondary signal representative of line/neutral current imbalance;

ground-fault detection circuitry coupled to the secondary signal and configured to generate a ground-fault trip signal when a ground-fault criterion is satisfied;

a leakage/continuity detection function associated with a flexible cord set, the function including series-connected shield conductors respectively surrounding the line and neutral conductors and shield-monitoring circuitry configured to detect open or high-resistance shield conditions and/or conductor-to-shield leakage, the shield-monitoring circuitry comprising:

a sense supply and sense return forming a detector-domain power source;

an open-shield (OS) detector coupled to the sense supply through the series-connected shield conductors;

an OS trigger driven by the OS detector, and an isolated trigger coupler (ITC) having an input side connected between the sense supply and the OS trigger and an output side referenced to a trip/actuation return, the ITC being operative to convey a control state to a trip stage and thereby provide a leakage trip signal;

a bi-stable electronic latch circuit operatively coupled to the switching circuitry and configured, in response to either the ground-fault trip signal or the leakage trip signal, to place the switching circuitry in the open state;

a grounded-neutral detection load (GNDL) connected across the load-side line and neutral conductors; and a self-test module comprising:

a simulated ground-fault generator;

a relay-synchronized switch configured to temporarily suppress normal ground-fault detection during self-test;

an auto-monitoring logic module configured to determine whether self-test fails; and an end-of-life switch operable to disconnect the supply terminals from the load terminals in response to a self-test failure indication.

18. The DMGI of claim 17, wherein the grounded-neutral detection load (GNDL) comprises an LED indicator circuit.

\* \* \* \* \*